United States Patent
Rasheed et al.

(10) Patent No.: US 7,183,227 B1
(45) Date of Patent: Feb. 27, 2007

(54) USE OF ENHANCED TURBOMOLECULAR PUMP FOR GAPFILL DEPOSITION USING HIGH FLOWS OF LOW-MASS FLUENT GAS

(75) Inventors: Muhammad M. Rasheed, Fremont, CA (US); Steven H Kim, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 139 days.

(21) Appl. No.: 10/884,628

(22) Filed: Jul. 1, 2004

(51) Int. Cl.
H01L 21/31 (2006.01)
H01L 21/469 (2006.01)
H01L 21/4763 (2006.01)
H01L 21/311 (2006.01)

(52) U.S. Cl. ............ 438/778; 438/758; 438/629; 438/694

(58) Field of Classification Search ........ 438/778, 438/758, 478, 629, 672, 763, 694
See application file for complete search history.

(56) References Cited

U.S. PATENT DOCUMENTS

| | | |
|---|---|---|
| 4,572,841 A | 2/1986 | Kaganowicz et al. |
| 4,690,746 A | 9/1987 | McInerney et al. |
| 4,737,379 A | 4/1988 | Hudgens et al. |
| 4,835,005 A | 5/1989 | Hirooka et al. |
| 4,872,947 A | 10/1989 | Wang et al. |
| 4,890,575 A | 1/1990 | Ito et al. |
| 4,892,753 A | 1/1990 | Wang et al. |
| 4,960,488 A | 10/1990 | Law et al. |
| 5,000,113 A | 3/1991 | Wang et al. |
| 5,089,442 A | 2/1992 | Olmer |
| 5,156,881 A | 10/1992 | Okano et al. |
| 5,271,972 A | 12/1993 | Kwok et al. |
| 5,275,977 A | 1/1994 | Otsubo et al. |
| 5,279,865 A | 1/1994 | Chebi et al. |
| 5,302,233 A | 4/1994 | Kim et al. |
| 5,314,724 A | 5/1994 | Tsukune et al. |
| 5,319,247 A | 6/1994 | Matsuura |
| 5,362,526 A | 11/1994 | Wang et al. |
| 5,416,048 A | 5/1995 | Blalock et al. |
| 5,468,342 A | 11/1995 | Nulty et al. |
| 5,507,881 A | 4/1996 | Sichanugrist et al. |

(Continued)

FOREIGN PATENT DOCUMENTS

EP 0 883 166 A2 9/1998

(Continued)

OTHER PUBLICATIONS

Abraham, "Reactive Facet Tapering of Plasma Oxide For Multilevel Interconnect Applications," VMIC Conference. pp. 115-121 (1987).

(Continued)

*Primary Examiner*—Chuong Anh Luu
(74) *Attorney, Agent, or Firm*—Townsend and Townsend and Crew LLP

(57) ABSTRACT

High flows of low-mass fluent gases are used in an HDP-CVD process for gapfill deposition of a silicon oxide film. An enhanced turbomolecular pump that provides a large compression ratio for such low-mass fluent gases permits pressures to be maintained at relatively low levels in a substrate processing chamber, thereby improving the gapfill characteristics.

28 Claims, 11 Drawing Sheets

U.S. PATENT DOCUMENTS

| | | | |
|---|---|---|---|
| 5,525,550 A | 6/1996 | Kato |
| 5,571,576 A | 11/1996 | Qian et al. |
| 5,589,233 A | 12/1996 | Law et al. |
| 5,593,741 A | 1/1997 | Ikeda |
| 5,599,740 A | 2/1997 | Jang et al. |
| 5,614,055 A | 3/1997 | Fairbairn et al. |
| 5,621,241 A | 4/1997 | Jain |
| 5,624,582 A | 4/1997 | Cain |
| 5,629,043 A | 5/1997 | Inaba et al. |
| 5,645,645 A | 7/1997 | Zhang et al. |
| 5,679,606 A | 10/1997 | Wang et al. |
| 5,712,185 A | 1/1998 | Tsai et al. |
| 5,719,085 A | 2/1998 | Moon et al. |
| 5,776,557 A | 7/1998 | Okano et al. |
| 5,786,039 A | 7/1998 | Brouquet |
| 5,804,259 A | 9/1998 | Robles |
| 5,807,785 A | 9/1998 | Ravi |
| 5,849,455 A | 12/1998 | Ueda et al. |
| 5,850,105 A | 12/1998 | Dawson et al. |
| 5,858,876 A | 1/1999 | Chew |
| 5,869,149 A | 2/1999 | Denison et al. |
| 5,872,052 A | 2/1999 | Iyer |
| 5,872,058 A | 2/1999 | Van Cleemput et al. |
| 5,874,350 A | 2/1999 | Nakagawa |
| 5,903,106 A | 5/1999 | Young et al. |
| 5,910,342 A | 6/1999 | Hirooka et al. |
| 5,913,140 A | 6/1999 | Roche et al. |
| 5,915,190 A | 6/1999 | Pirkle |
| 5,937,323 A | 8/1999 | Orczyk et al. |
| 5,953,635 A | 9/1999 | Andideh |
| 5,968,610 A | 10/1999 | Liu et al. |
| 5,976,327 A | 11/1999 | Tanaka |
| 5,990,000 A | 11/1999 | Hong et al. |
| 5,990,013 A | 11/1999 | Berenguer et al. |
| 6,013,191 A | 1/2000 | Nasser-Faili et al. |
| 6,013,584 A | 1/2000 | M'Saad |
| 6,030,666 A | 2/2000 | Lam et al. |
| 6,030,881 A | 2/2000 | Papasouliotis et al. |
| 6,037,018 A | 3/2000 | Jang et al. |
| 6,039,851 A | 3/2000 | Iyer |
| 6,042,901 A | 3/2000 | Denison et al. |
| 6,059,643 A | 5/2000 | Hu et al. |
| 6,070,551 A | 6/2000 | Li et al. |
| 6,071,573 A | 6/2000 | Koemtzopoulos et al. |
| 6,074,959 A | 6/2000 | Wang et al. |
| 6,077,786 A | 6/2000 | Chakravarti et al. |
| 6,096,646 A | 8/2000 | Lee et al. |
| 6,106,678 A | 8/2000 | Shufflebotham et al. |
| 6,136,685 A | 10/2000 | Narwankar et al. |
| 6,147,009 A | 11/2000 | Grill et al. |
| 6,149,976 A | 11/2000 | Matsuki et al. |
| 6,149,986 A | 11/2000 | Shibata et al. |
| 6,167,834 B1 | 1/2001 | Wang et al. |
| 6,170,428 B1 | 1/2001 | Redeker et al. |
| 6,174,808 B1 | 1/2001 | Jang et al. |
| 6,182,602 B1 | 2/2001 | Redeker et al. |
| 6,184,158 B1 | 2/2001 | Shufflebotham et al. |
| 6,189,483 B1 | 2/2001 | Ishikawa et al. |
| 6,190,233 B1 | 2/2001 | Hong et al. |
| 6,191,026 B1 | 2/2001 | Rana et al. |
| 6,194,037 B1 | 2/2001 | Terasaki et al. |
| 6,194,038 B1 | 2/2001 | Rossman |
| 6,197,705 B1 | 3/2001 | Vassiliev |
| 6,200,412 B1 | 3/2001 | Kilgore et al. |
| 6,203,863 B1 | 3/2001 | Liu et al. |
| 6,217,658 B1 | 4/2001 | Orczyk et al. |
| 6,224,950 B1 | 5/2001 | Hirata |
| 6,228,751 B1 | 5/2001 | Yamazaki et al. |
| 6,230,650 B1 | 5/2001 | Yamazaki |
| 6,232,196 B1 | 5/2001 | Raaijmakers et al. |
| 6,313,010 B1 | 11/2001 | Nag et al. |
| 6,326,064 B1 | 12/2001 | Denison et al. |
| 6,335,288 B1 | 1/2002 | Kwan et al. |
| 6,346,302 B2 | 2/2002 | Kishimoto et al. |
| 6,372,291 B1 | 4/2002 | Hua et al. |
| 6,395,150 B1 | 5/2002 | Van Cleemput et al. |
| 6,416,823 B2 | 7/2002 | Li et al. |
| 6,465,044 B1 | 10/2002 | Jain et al. |
| 6,503,843 B1 | 1/2003 | Xia et al. |
| 6,531,193 B2 | 3/2003 | Fonash et al. |
| 6,537,929 B1 | 3/2003 | Cheung et al. |
| 6,559,026 B1 * | 5/2003 | Rossman et al. ........... 438/424 |
| 6,589,610 B2 | 7/2003 | Li et al. |
| 6,589,611 B1 | 7/2003 | Li et al. |
| 6,596,653 B2 | 7/2003 | Tan et al. |
| 6,596,654 B1 | 7/2003 | Bayman et al. |
| 6,607,983 B1 | 8/2003 | Chun et al. |
| 6,626,188 B2 | 9/2003 | Fitzsimmons et al. |
| 6,653,203 B1 | 11/2003 | Huang et al. |
| 6,673,722 B1 | 1/2004 | Yamazaki |
| 6,713,390 B2 | 3/2004 | M'Saad et al. |
| 2001/0028924 A1 | 10/2001 | Sherman |
| 2001/0033900 A1 | 10/2001 | M'Saad et al. |
| 2002/0187655 A1 | 12/2002 | Tan |
| 2002/0192396 A1 | 12/2002 | Wang et al. |
| 2003/0056900 A1 | 3/2003 | Li et al. |
| 2003/0159656 A1 | 8/2003 | Tan et al. |
| 2003/0203637 A1 | 10/2003 | Hua et al. |
| 2003/0219540 A1 | 11/2003 | Law et al. |
| 2004/0146661 A1 * | 7/2004 | Kapoor et al. .............. 427/569 |

FOREIGN PATENT DOCUMENTS

| | | |
|---|---|---|
| GB | 2 267 291 A | 12/1993 |
| JP | 2058836 A | 2/1990 |
| JP | 7-161703 A | 6/1995 |

OTHER PUBLICATIONS

Alonso, J.C. et al., "High rate-low temperature deposition of silicon dioxide films . . . " JVST A 13(6) Nov./Dec. 1995, pp. 2924-2929.

Bar-Ilan et al., "A comparative study of sub-micron gap filling and planarization techniques", SPIE vol. 2636, Oct. 1995, . 277-288.

Broomfield et al., "HDP Dielectric BEOL Gapfill: A Process for Manufacturing", IEEE/SEMI Advanced Semiconductor Manufacturing Conference 1996, pp. 255-258.

Conti et al., "Processing methods to fill High aspect ratio gaps without premature constriction," DUMIC Conference, Feb. 8-9, 1999, pp. 201-209.

Horiike et al., "High rate and highly selective Si02 etching employing inductively coupled plasma and discussion on reaction kinetics", JVST A 13(3) May/Jun. 1995, pp. 801-809.

Kuo et al., "Thick SiO2 films obtained by plasma-enhanced chemical vapor deposition using hexamethyldisilazane, Carbon dioxide and hydrogen", Journal of The Electrochemical Society, 147 (7) 2000 p. 2679-2684.

Lee et al., "Dielectric Planarization Techniques For Narrow Pitch Multilevel Interconnects," VMIC Conference, pp. 85-92 (1987).

Lee et al., "Low Temperature Silicon Nitride and silicon Dioxide Films . . . " JECS; 147 (4) 2000, pp. 1481-1486.

Lim et al., "Gap-fill Performance and Film properties of PMD Films for the 65 nm device Technology", IEEE International Symposium on Semiconductor Manufacturing, Sep. 30-Oct. 2, 2003, p. 435-438.

Meeks et al., "Modeling of SiO 2 deposition in high density plasma reactors and comparisons of model predictions with experimental measurements," J. Vac. Sci. Technol. A, 16(2):544-563 (1998).

Musaka, "Single Step Gap Filling Technology fo Subhalf Micron Metal Spacings on Plasma Enhanced TEOS/O2 Chemical Vapor Deposition System," International Conference on Solid State Devices and Materials pp. 510-512, held in Japan, (1993).

Nag et al., "Comparative Evaluation of gap- fill dielectrics in shallow trench isolation for sub-0.25 micron Technologies" IEDM 1996, . 841-844.

Nalwa, H.S., *Handbook of Low and High Dielectric Constant Materials and Their Applications*, vol. 1, p. 66 (1999).

Nguyen, s.v., "High-Density Plasma Chemical Vapor Deposition of Silicon-Based Dielectric Films for Integrated Circuits," Journal of Research and Development, vol. 43, 1/2 (1999).

Pai, "High quality voids free oxide deposition", Materials Chemistry and Physics, 44, 1996, pp. 1-8.

Pankov et al., "The effect of hydrogen addition on the fluorine doping level of SiO2 films prepared by remote plasma enhanced chemical vapor deposition using SiF4-based plasmas", Japanese Journal of Applied Physics part 1,37 (11) Nov. 1998, pp. 6135-6141.

Peters, "Choices and challenges for shallow trench isolation", Semiconductor International, Apr. 1999, pp. 69-76.

Qian et al., "High Density Plasma Deposition and Deep Submicron Gap Fill with Low Dielectric Constant SiO2 Films," DUMIC Conference, Feb. 21-22, 1995, pp. 50-56, held in California.

Takahashi et al., "The Effect of Gas-phase additives C2H4, C2H6 and C2H2 on SiH4/O2 chemical vapor deposition". Journal of the Electrochemical Society, 143 (4) Apr. 1996, pp. 1355-1361.

Takeishi et al., "Fluorocarbon films deposited by PECVD with . . . " DUMIC 1996, pp. 71-77.

Vassiliev et al., "Trends in void-free pre-metal CVD dielectrics," Solid State Technology, Mar. 2001, pp. 129-136, www.solid-state.com.

Vassiliev et al., "Properties and Gap-Fill Capability of HPD-CVD Phosphosilicate Glass Films for Subquarter-Micrometer ULSI Device Technology" Electrochemical and Solid-State Letters 3 (2), 2000, pp. 80-83.

Vassiliev, "Void-free pre-metal dielectric gap- fill capability with CVD films for subquarter-micron ULSI" DUMIC, Feb. 28-29, 2000, pp. 121-132.

Xia et al., "High aspect ratio trench filling sing two-step . . . " JECS, 146 (5),1999, p. 1884-1888.

Xia et al., "High Temperature Subatmospheric Chemical Vapor Deposited Undoped Silicate Glass," JECS 146 (3) 1999, pp. 1181-1185.

Yota et al., "Advanced passivation layer using high-density plasma CVD oxide for 0.25 micron CMOS Technology" DUMIC, Feb. 16-17, 1998,pp. 185-192.

Yota et al., "Extendibility of ICP high-density plasma CVD for use as Intermetal dielectric and passivation layers for 0.18 micron technology," DUMIC Feb. 8-9, 1999, pp. 71-82.

* cited by examiner

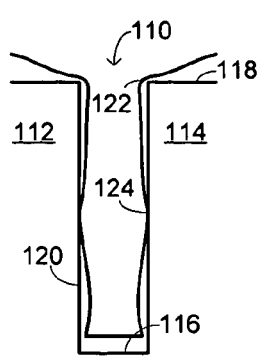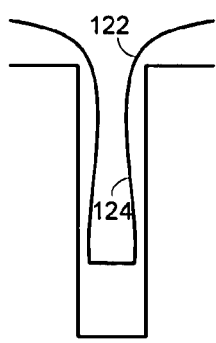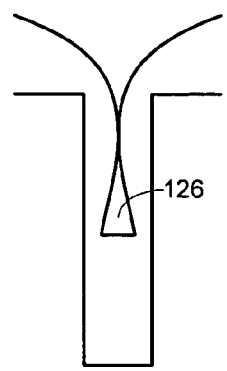
Fig. 1A  Fig. 1B  Fig. 1C
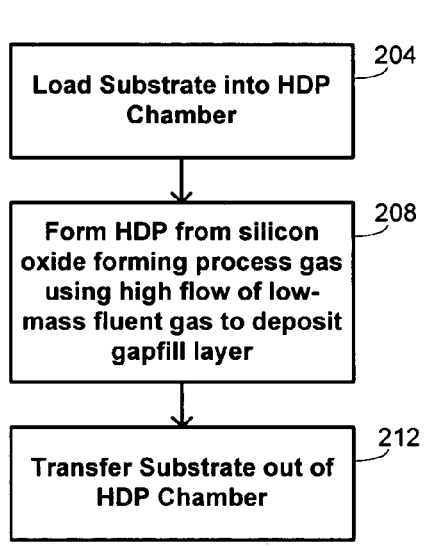
Fig. 2
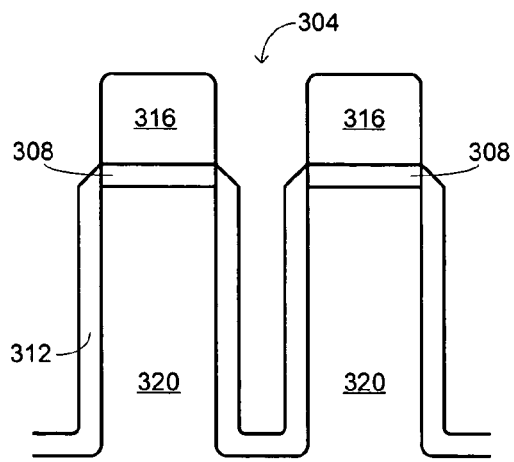
Fig. 3
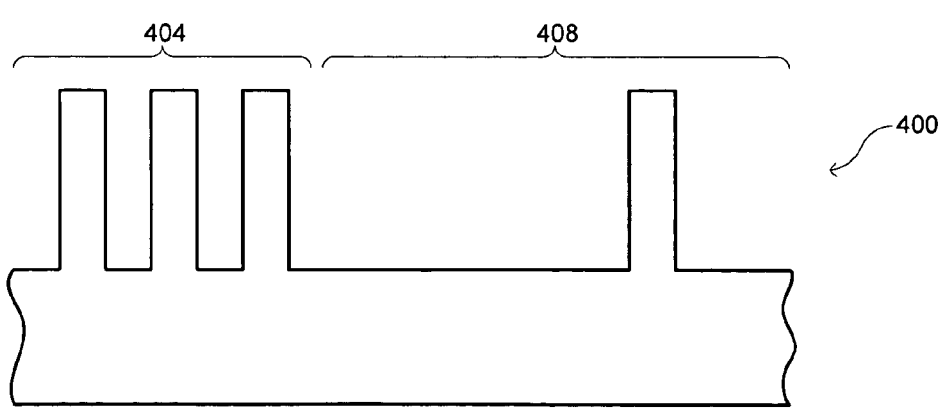
Fig. 4

USE OF ENHANCED TURBOMOLECULAR
PUMP FOR GAPFILL DEPOSITION USING
HIGH FLOWS OF LOW-MASS FLUENT GAS

BACKGROUND OF THE INVENTION

One of the primary steps in the fabrication of modern semiconductor devices is the formation of a film, such as a silicon oxide film, on a semiconductor substrate. Silicon oxide is widely used as an insulating layer in the manufacture of semiconductor devices. As is well known, a silicon oxide film can be deposited by a thermal chemical-vapor deposition ("CVD") process or by a plasma-enhanced chemical-vapor deposition ("PECVD") process. In a conventional thermal CVD process, reactive gases are supplied to a surface of the substrate, where heat-induced chemical reactions take place to produce a desired film. In a conventional plasma-deposition process, a controlled plasma is formed to decompose and/or energize reactive species to produce the desired film.

Semiconductor device geometries have decreased significantly in size since such devices were first introduced several decades ago, and continue to be reduced in size. This continuing reduction in the scale of device geometry has resulted in a dramatic increase in the density of circuit elements and interconnections formed in integrated circuits fabricated on a semiconductor substrate. One persistent challenge faced by semiconductor manufacturers in the design and fabrication of such densely packed integrated circuits is the desire to prevent spurious interactions between circuit elements, a goal that has required ongoing innovation as geometry scales continue to decrease.

Unwanted interactions are typically prevented by providing spaces between adjacent elements that are filled with an electrically insulative material to isolate the elements both physically and electrically. Such spaces are sometimes referred to herein as "gaps" or "trenches," and the processes for filling such spaces are commonly referred to in the art as "gapfill" processes. The ability of a given process to produce a film that completely fills such gaps is thus often referred to as the "gapfill ability" of the process, with the film described as a "gapfill layer" or "gapfill film." As circuit densities increase with smaller feature sizes, the widths of these gaps decrease, resulting in an increase in their aspect ratio, which is defined by the ratio of the gap's height to its depth. High-aspect-ratio gaps are difficult to fill completely using conventional CVD techniques, which tend to have relatively poor gapfill abilities. One family of electrically insulating films that is commonly used to fill gaps in intermetal dielectric ("IMD") applications, premetal dielectric ("PMD") applications, and shallow-trench-isolation ("STI") applications, among others, is silicon oxide (sometimes also referred to as "silica glass" or "silicate glass").

Some integrated circuit manufacturers have turned to the use of high-density plasma CVD ("HDP-CVD") systems in depositing silicon oxide gapfill layers. Such systems form a plasma that has a density greater than about $10^{11}$ ions/cm$^3$, which is about two orders of magnitude greater than the plasma density provided by a standard capacitively coupled plasma CVD system. Examples of HDP-CVD systems include inductively coupled plasma ("ICP") systems and electron-cyclotron-resonance ("ECR") systems, among others. One factor that allows films deposited by HDP-CVD techniques to have improved gapfill characteristics is the occurrence of sputtering simultaneous with deposition of material. Sputtering is a mechanical process by which material is ejected by impact, and is promoted by the high ionic density of the plasma in HDP-CVD processes. The sputtering component of HDP deposition thus slows deposition on certain features, such as the corners of raised surfaces, thereby contributing to the increased gapfill ability.

A variety of known techniques have often used to promote the sputtering effect, and have proved successful for gaps with relatively modest aspect ratios and widths. For example, one technique to promote sputtering is to introduce argon or a similar heavy inert gas to further promote the sputtering effect. Another technique is to create an electric field that biases the plasma towards the substrate, such as by using an electrode within a substrate support pedestal to generate the electric field. It was thus initially thought that the simultaneous deposition and sputtering characteristics of an HDP-CVD process could be used to fill the gaps that were created in almost any application. Semiconductor manufacturers discovered, however, that there is a practical limit to the aspect ratio of gaps that HDP-CVD films are able to fill. For example, one HDP-CVD process commonly used to deposit a silicon oxide gapfill film forms a plasma from a process gas that includes silane $SiH_4$, molecular oxygen $O_2$, and argon Ar. It has been reported that when such a process is used to fill certain narrow-width, high-aspect-ratio gaps, the sputtering caused by the argon in the process gas may hamper gapfill efforts. Specifically, it has been reported that material sputtered by argon in the process redeposits on the upper portions of the sidewalls of the gaps being filled at a rate faster than at the lower portions. This, in turn, may result in the formation of a void in the gap if the upper areas of regrowth join before the gap is completely filled.

BRIEF SUMMARY OF THE INVENTION

Embodiments of the invention make use high flows of low-mass fluent gases in an HDP-CVD process for gapfill deposition of a silicon oxide film. An enhanced turbomolecular pump that provides a large compression ratio for such low-mass fluent gases permits pressures to be maintained at relatively low levels in a substrate processing chamber, thereby improving the gapfill characteristics.

Thus, in one set of embodiments, a method is provided for depositing a silicon oxide film over a substrate disposed in a substrate processing chamber. The substrate has a trench formed between adjacent raised surfaces. A process gas that comprises a silicon source, an oxygen source, and a fluent gas is flowed into the substrate processing chamber. The fluent gas has an average molecular mass less than 10 atomic mass units and is flowed into the substrate processing chamber with a flow rate that exceeds 400 sccm. A plasma having an ion density of at least $10^{11}$ ions/cm$^3$ is formed from the process gas to deposit the silicon oxide film over the substrate and within the trench. The process gas is pumped from the substrate processing chamber with a pump that provides a compression ratio for the fluent gas that exceeds $10^5$.

In some such embodiments, the fluent gas comprises $H_2$, in which case the pump may provide a compression ratio for $H_2$ between $10^5$ and $10^6$ in some instances. In other embodiments, the fluent gas comprises He, in which case the pump may provide a compression ratio for He between $10^6$ and $10^7$ in some instances. In still other embodiments, the fluent gas comprises a plurality of molecules having different chemical structures, at least some of the molecules being selected from the group consisting of $H_2$ and He. In different embodiments, the flow rate for the fluent gas may also exceed 800 sccm or may exceed 1200 sccm. The silicon source may comprise $SiH_4$ and/or the oxygen source may comprise $O_2$.

In addition, in some instances, the process gas may further comprise a dopant source to dope the silicon oxide film.

In another set of embodiments, a method is also provided for depositing a silicon oxide film over a substrate disposed in a substrate processing chamber. The substrate has a trench formed between adjacent raised surfaces. A process gas that comprises a silicon source, an oxygen source, and a fluent gas is flowed into the substrate processing chamber. The fluent gas has an average molecular mass less than 10 atomic mass units and is flowed into the substrate processing chamber with a flow rate that exceeds 400 sccm. A plasma having an ion density of at least $10^{11}$ ions/cm$^3$ is formed from the process gas to deposit the silicon oxide film over the substrate and within the trench. A chamber pressure is maintained within the substrate processing chamber less than 15 mtorr. In certain specific embodiments, different fluent gases may be used with different flow rates, and certain specific silicon and oxygen sources may be used, as described above. In some embodiments, the chamber pressure may be maintained less than 10 mtorr or less than 5 mtorr.

Methods of the invention may be implemented using a substrate processing system that comprises a housing defining a substrate processing chamber. A substrate holder is configured to hold a substrate within the substrate processing chamber during substrate processing. A gas-delivery system is configured to introduce gases into the substrate processing chamber. A high-density plasma generating system is operatively coupled to the substrate processing chamber to generate a plasma having at least $10^{11}$ ions/cm$^3$ from gases in the substrate processing chamber. A pressure-control system maintains a selected pressure within the substrate processing chamber. The pressure-control system includes a pump in fluid communication with on outlet of the substrate processing chamber and provides a compression ratio greater than $10^5$ for a gas of molecules having an average molecular mass less than 10 atomic mass units.

The pump may be a turbomolecular pump. In a specific embodiment, the pump provides a compression ratio for $H_2$ between $10^5$ and $10^6$. In another specific embodiment, the pump provides a compression ratio for He between $10^6$ and $10^7$. The pump may also provide certain pumping speeds for the gas of molecules having an average molecular mass less than 10 atomic mass units. For instance, in one embodiment, that pumping speed exceeds 2800 L/s. In another embodiment the pumping speed is between 2800 and 3500 L/s for a gas selected from the group consisting of $H_2$ and He.

Embodiments of the invention also provide a method for upgrading a semiconductor processing facility to accommodate a high-density-plasma deposition process that uses a flow of a gas having an average molecular mass less than 10 amu at a rate that exceeds 400 sccm. The semiconductor processing facility includes a high-density-plasma substrate processing system that has a substrate processing chamber in fluid communication with a turbomolecular pump, a rough pump, and a foreline. The turbomolecular pump controls a pressure inside the substrate processing chamber. The rough pump provides a pressure intermediate between a desired operational pressure and atmospheric pressure. The foreline provides fluid communication between the turbomolecular pump and the rough pump. A pressure inside the substrate processing chamber during the high-density-plasma deposition process is determined. The foreline is reconfigured to reduce a pressure at an outlet of the turbomolecular pump to the foreline. The pressure inside the substrate processing chamber during the high-density-plasma process is consequently reduced.

The foreline may be reconfigured by increasing a diameter of at least a portion of the foreline, by reducing a number of bends comprised by the foreline, and the like. In one embodiment, the method further comprises upgrading a flow capacity of the rough pump.

A further understanding of the nature and advantages of the present invention may be realized by reference to the remaining portions of the specification and the drawings.

BRIEF DESCRIPTION OF THE DRAWINGS

FIGS. 1A–1C are simplified cross-sectional views of a silicon oxide film at different stages of deposition within a narrow-width, high-aspect-ratio gap according to a prior-art silicon oxide deposition process;

FIG. 2 is a flow diagram illustrating an embodiment for depositing a gapfill layer with a high flow of a low-mass fluent gas;

FIG. 3 is a simplified cross-sectional view of a trench in a shallow-trench isolation structure, which embodiments of the invention may be used to fill;

FIG. 4 is a simplified cross-sectional view of a partially completed integrated circuit having trenches to be filled with a dielectric material in both a densely packed area and an open area;

DETAILED DESCRIPTION OF THE INVENTION

Figure 5:
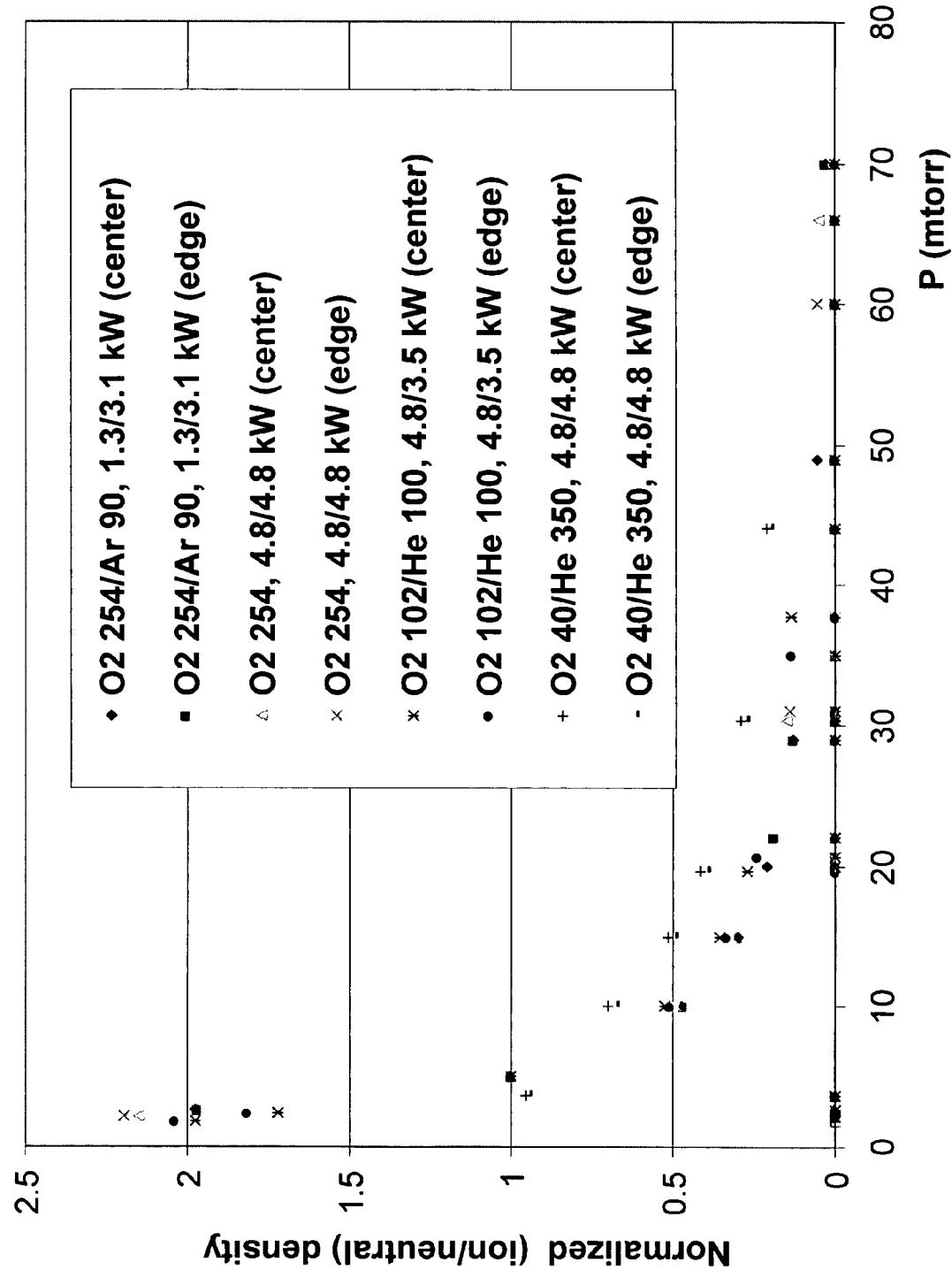
FIG. 5 is a graph illustrating the effect of chamber pressure on relative ion density in HDP-CVD processes.

Embodiments of the invention are directed to methods and systems that permit improved gapfill characteristics during the deposition of silica glass films. The effect of redeposition on gapfill that is addressed by embodiments of the invention is illustrated with FIGS. 1A–1C, which are simplified cross-sectional views of a silicon oxide film at different stages of deposition. The sequence of these drawings demonstrates how the gapfill limits of conventional HDP-CVD processing may be reached for certain small-width gaps having relatively large aspect ratios. For purposes of illustration, the gapfill problem illustrated in this sequence of drawings has been exaggerated.

FIG. 1A shows the initial stages of film deposition over a substrate having a gap 110 defined by two adjacent features 112 and 114 formed over the substrate. The conventional HDP-CVD silicon oxide deposition process results in direct silicon oxide deposition on the horizontal surface 116 at the bottom of the gap 110, and on horizontal surfaces 118 above the features 112 and 114. The process also results in indirect deposition, referred to herein as "redeposition," of silicon oxide material on the sidewalls 120 as a result of recombination of material sputtered from the silicon oxide film as it grows. In certain small-width high-aspect-ratio applications, the continued growth of the silicon oxide film results in formations 122 on the upper section of the sidewall 120. These formations grow towards each other at a rate of growth exceeding the rate at which the film grows laterally on lower portions 124 of the sidewalls, as illustrating for an intermediate time in FIG. 1B. The final result of this process is shown in FIG. 1C, in which a void has been formed within the deposited material because the formations 122 have grown together.

It has recently been discovered that the gapfill capability for aggressive gaps may be improved through the use of relatively high flows of fluent gases that have a low average molecular mass. Such a technique may be used in the fabrication of a variety of integrated circuits, particularly in the fabrication of integrated circuits having minimum features sizes of 90 nm or less, and may be used with minimum feature sizes as small as 65 nm, 45 nm, or 30 nm. References herein to a "molecular mass" are intended to include the atomic mass of single-atom molecules, such as may exist for inert elements like helium, etc. A "low" average molecular mass corresponds in some embodiments to an average molecular mass less than about 10 atomic mass units ("amu"), and in some instances may be as low as about 4 amu or about 2 amu. A "high" flow rate corresponds to a flow rate that exceeds 400 sccm, and which may in some embodiments be 800 sccm or more, be 1200 sccm or more, or even as high as about 2500 sccm or more in certain specific applications.

The technique is outlined generally with the flow diagram of FIG. 2, which illustrates deposition of an undoped silica glass ("USG"), and FIG. 3, which is a simplified cross-sectional view of a substrate having a trench etched therein as part of an STI structure. It should be understood that in other embodiments, the techniques of the invention may be applied to IMD and PMD applications, among others. As indicated at block 204, the technique begins by loading a substrate into a substrate processing chamber. The substrate has one or more gaps formed between adjacent raised features, such as trench 304 shown in FIG. 3. The raised features may be, for example, dielectric hardmasks, adjacent metal lines, transistor gates, or other features. In the specific example of FIG. 3, the raised features represent areas of a silicon substrate 320 between trenches etched in the substrate 320. The STI structure shown in FIG. 3 also includes silicon nitride portions 316 formed above the raised features and a silicon oxide interface or pad oxide 308 formed between the silicon nitride portions 316 and the silicon substrate 320. Also shown in FIG. 3 is an oxide or nitride liner layer 312, such as an in situ steam generation ("ISSG") oxide or other thermal oxide layer, or an LPCVD or PECVD silicon nitride layer. In some applications, the trench 304 has an aspect ratio of between 4:1 and 6:1, and the formation of a highly conformal film such as oxide or nitride layer 312 may increase the aspect ratio even further.

Once the substrate is properly positioned, a high-density plasma is formed at block 208 of FIG. 2 from a process gas to provide simultaneous deposition and sputtering components, with which the silicon oxide is deposited as a gapfill layer. The process gas includes a fluent gas having a low average molecular mass provided at a high flow rate. The low average molecular mass may be provided with a flow of a single low-mass molecule, such as with a flow of $H_2$ or He, or may be provided in some embodiments with a mixture of gases in relative proportions that ensure the average molecular mass of the mixture is low. Examples of suitable mixtures include $H_2$/He mixtures, as well as $H_2$/Ar and He/Ar (or $H_2$/Ne and He/Ne) mixtures in cases where the Ar (or Ne) flow is substantially less than the $H_2$ or He flow, and may include mixtures of more than two gases as in cases where a $H_2$/He/Ar or $H_2$/He/Ne flow is used. Mixtures may be provided with separate flows of the individual gases or may be provided by premixing the gases before flowing the fluent gas to the process chamber. Inclusion of small amounts of relatively heavy gases in the fluent, even while maintaining the average molecular mass low, may improve deposition uniformity and may permit a significant cost saving because of the relatively high cost of $H_2$ and He sources compared with sources of other inert gases. These benefits may be realized even when the flow of $H_2$ or He is significantly greater than the flow of a heavier gas such as Ar.

The process gas also includes a silicon source, such as monosilane $SiH_4$ and an oxygen source such as molecular oxygen $O_2$. Dopants may be added to the film by including a precursor gas with the desired dopant, such as by including a flow of $SiF_4$ to fluorinate the film, including a flow of $PH_3$ to phosphorate the film, including a flow of $B_2H_6$ to boronate the film, including a flow of $N_2$ to nitrogenate the film, and the like. Even when such dopants are included in the deposited film, it is still considered herein to be a "silicon oxide film." After deposition of the gapfill layer is complete, the substrate is transferred out of the deposition chamber at block 212 in preparation for subsequent processing.

The specific gapfill characteristics for production of a given integrated circuit may differ. For example, FIG. 4 provides an illustration of an integrated circuit 400 that has areas 404 of densely packed active devices where transistors are formed, and areas 408 where the active devices are relatively isolated. These isolated areas 408 are sometimes referred to in the art as "open areas," and may have devices that are separated by distances more than an order of magnitude or more than the spacing between devices in the densely packed active are 404. Sidewall deposition has been found to occur at a significantly higher rate on gaps formed in the densely packed portion of the integrated circuit 400 than on gaps formed in the open areas 408. The use of a high flow of a low-mass fluent gas is thus especially suitable for deposition in densely packed areas.

A number of specific parameters using such techniques have been described in copending, commonly assigned U.S. patent application Ser. No. 09/854,406, entitled "HYDROGEN ASSISTED UNDOPED SILICON OXIDE DEPOSITION PROCESS FOR HDP-CVD," filed May 11, 2001 and U.S. patent application Ser. No. 10/350,445 entitled "HYDROGEN ASSISTED HDP-CVD DEPOSITION PROCESS FOR AGGRESSIVE GAP-FILL TECHNOLOGY," filed Jan. 23, 2003 by Bikram Kapoor et al., the entire disclosures of both of which are incorporated herein by reference for all purposes. A relatively high flow rate of a low-mass fluent gas acts to reduce redeposition on the sidewalls, thereby enabling narrow-width, high-aspect-ratio gaps to be filled in more of a bottom-up manner. As is known to those of skill in the art, some HDP gapfill applications operate the chamber with a throttle valve that controls flow to an exhaust foreline in a fully open position. When the system is used with the throttle valve in a fully open position, the pressure within a given chamber is controlled by the pumping capacity of a vacuum pump(s) and the rate at which gases are introduced into the chamber. It has generally been desirable during HDP-CVD processes for chamber pressure levels to be maintained at a low level because dissociated species of the process gas then have a longer mean free path and reduced angular distribution, thus enabling them to reach and take place in chemical reactions at the bottom of trenches. This has thus tended to improve the bottom-up gapfill characteristics of gapfill processes.

In experiments using a high flow of low-mass fluent gases, it was found that deposition was improved despite an increase in the chamber pressure above what is normally considered desirable. For example, in some experiments using high flows of $H_2$, the chamber pressure would approach 50 mtorr even with the throttle valve fully open. The inventors hypothesized that still better deposition might be achieved if the pressure within the process chamber could be reduced while still providing a high flow rate of a low-mass gas. When the pressure of the chamber is relatively high, the flow of gases within the chamber is dominated by the flow profile generated by the gas input sources; conversely, when the pressure is lower, the flow profile is more diffusive, allowing application of bias and such factors to improve the control over where the ions react to form the silicon oxide layer. Another reason contributing to this expectation is illustrated with the graph in FIG. 5, which shows the results of measurements of relative levels of ionic and neutral species in a plasma as a function of chamber pressure. In particular, the ordinate plots the normalized density of ionic species to neutral species in the plasma, with the different symbols corresponding to a different number of process parameters. The legend identifies the flow rates of gases provided to a chamber in sccm, as well as rf power levels applied to the top and sides of the chamber, with an indication of whether measurements were taken near the edge or near the center of a process wafer. For example, the notation "O2 102/He 100, 4.8/3.5 kW (edge") indicates a process with an $O_2$ flow of 102 sccm, a He flow of 100 sccm, a top rf power of 4.8 kW, a side rf power of 3.5 kW, for measurements taken near the wafer edge.

The results of FIG. 5 show consistently that the ratio of ionic to neutral species in the plasma decreases exponentially with chamber pressure. This ratio is, however, relevant for bottom-up gapfill because it is the ionic species that react more readily in the formation of the silicon oxide film as it is deposited. The ions in the plasma thus contribute, in a relative sense, more to bottom-up deposition within the gap than they do to growth of the film above the raised features adjacent to the gap. The effect of the exponential decrease is very marked in FIG. 5 and demonstrates that a very significant improvement in the density of ionic species to neutral species is achieved when the chamber pressure is less than about 10 mtorr.

The inventors were thus prompted to consider how the chamber pressure could be reduced despite the very high flow rates of the low-mass fluent gas. Attempts to vary the configuration of existing HDP deposition systems had proved incapable of reducing the pressure, including attempts to vary the opening level of the throttle valve, to vary the operating power, to vary the flow rates, and the like, consistent with constraints dictated by process characteristics. The inventors eventually hypothesized that perhaps the performance characteristics of the vacuum pump varied depending on the mass of individual molecules or ions, so that less-massive molecules were being pumped out of the processing chamber less efficiently than more-massive molecules. Accordingly, the inventors requested the special manufacture of pumps having specified performance characteristics specifically for low-mass molecules, which they substituted for pumps in existing HDP deposition systems. It was not immediately apparent when requesting the modified performance characteristics what effect they would have on the overall deposition because the efficiency of exhausting the higher-mass silane and oxygen species from the chamber could also be affected. The effect of including pumps having the specified performance characteristics was, however, discovered to successfully lower the chamber pressure and to further enhance the gapfill characteristics of the process.

Figure 6A:
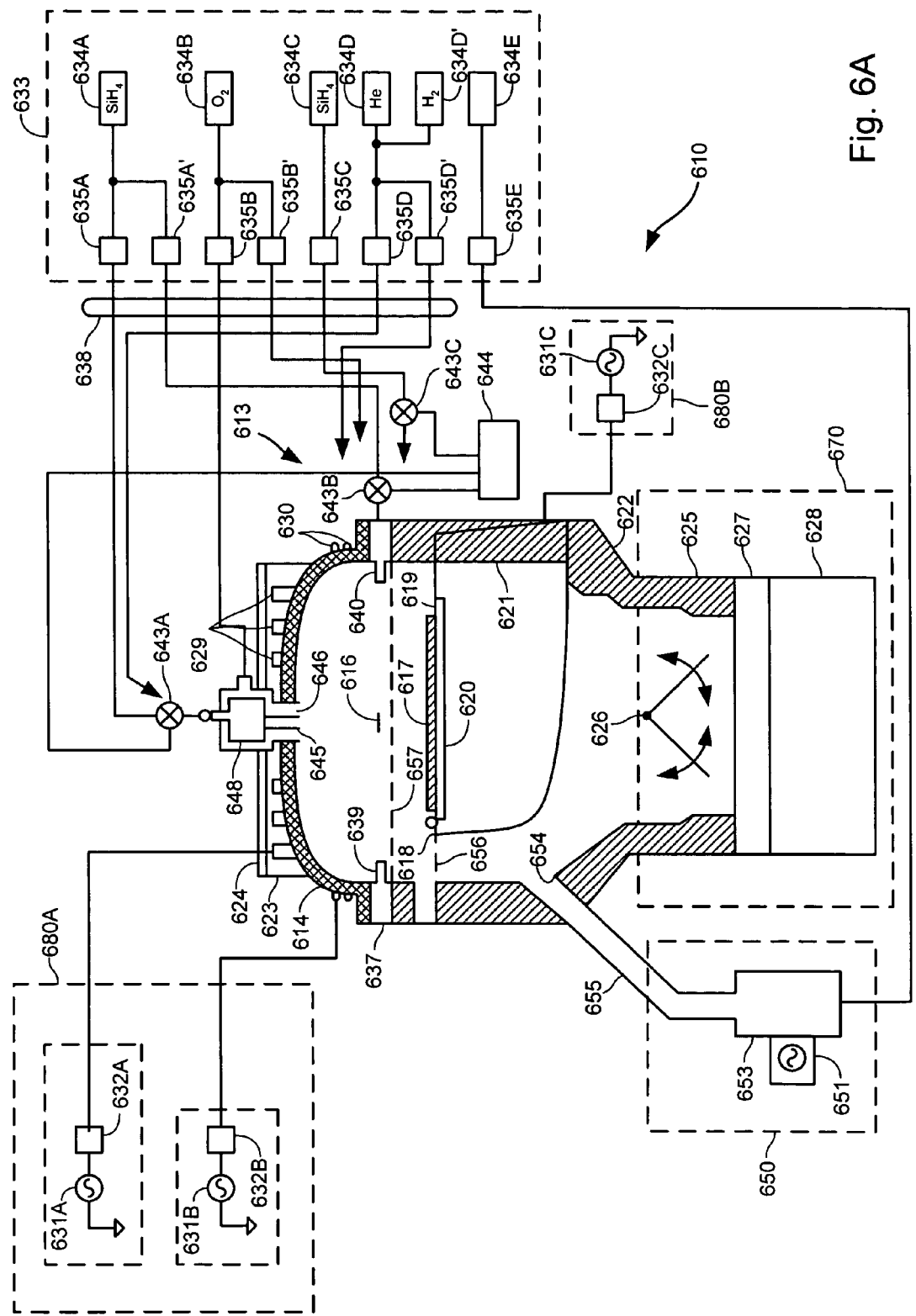
FIG. 6A is a simplified cross-sectional view of an exemplary substrate processing system according to an embodiment of the invention.
Figure 6B:
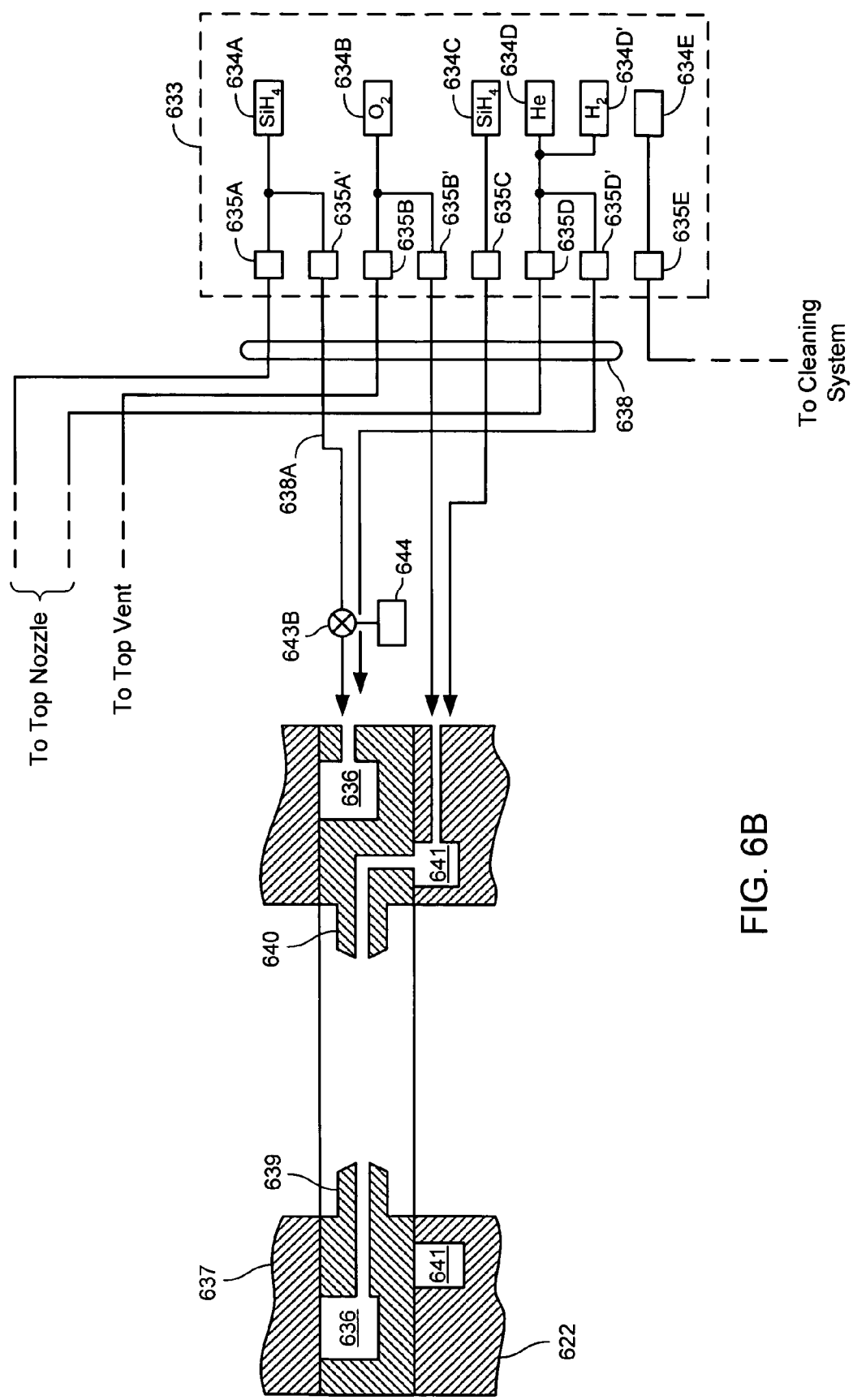
FIG. 6B is a simplified cross-sectional view of a gas ring that may be used in conjunction with the exemplary CVD processing chamber of FIG. 7A.
Figure 6C:
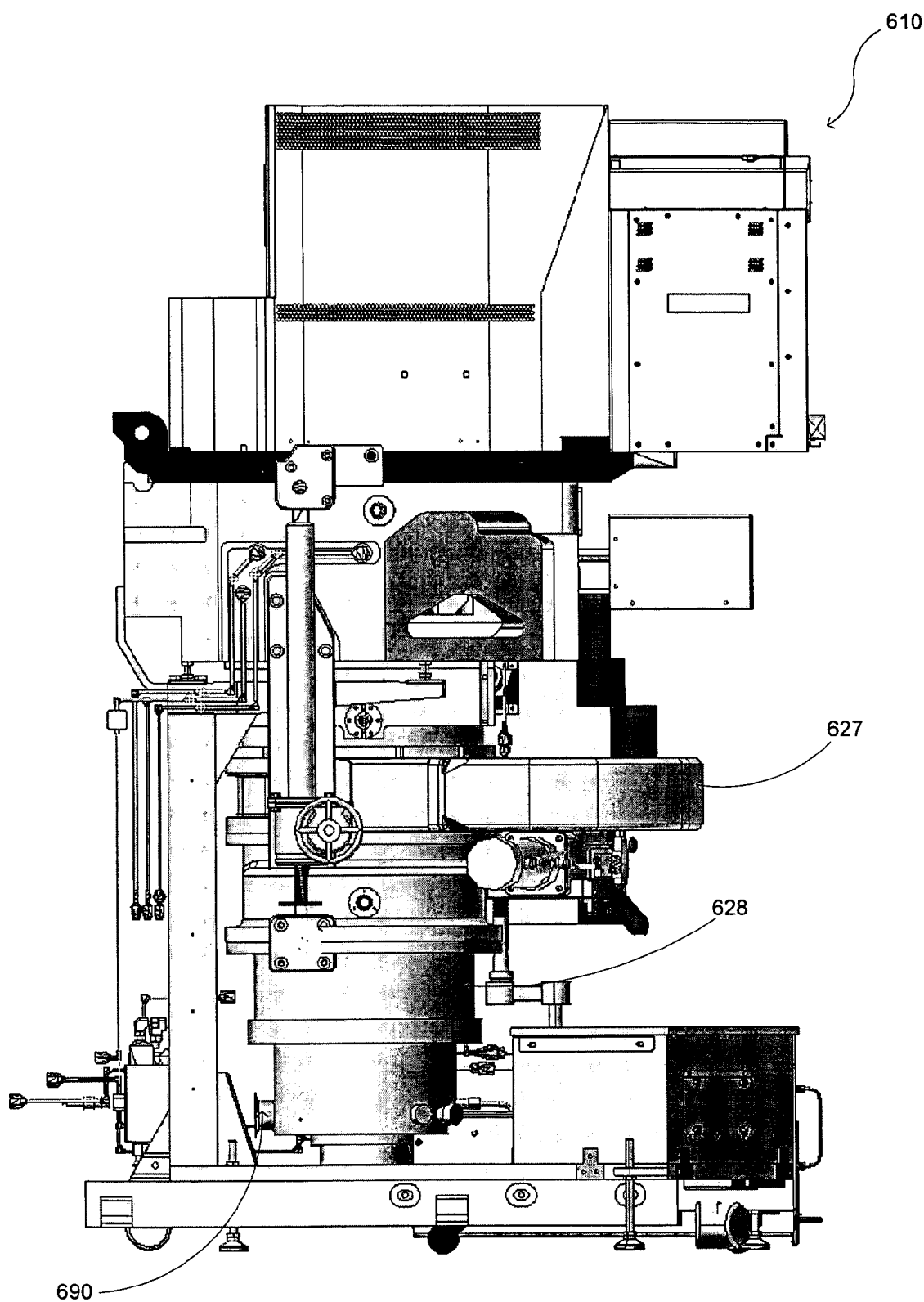
FIG. 6C is a perspective view of the substrate processing system of FIG. 6A, illustrating the integration of a small-molecule-enhanced turbo pump.

One example of an HDP substrate processing system with which such a modified pump may be used is the ULTIMA™ system, manufactured by APPLIED MATERIALS, INC., of Santa Clara, Calif., and described in commonly assigned U.S. Pat. No. 6,170,428, filed Jul. 15, 1996, entitled "Symmetric Tunable Inductively-Coupled HDP-CVD Reactor," having Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha listed as co-inventors, the entire disclosure of which is incorporated herein by reference. A specific description of a modified HDP substrate processing system provided in accordance with an embodiment of the invention is described below. FIGS. 6A–6C provide a general overview of the system, with certain aspects of the small-molecule-enhanced turbomolecular pump integrated to the system described in connection with FIGS. 7–9. FIG. 6A schematically illustrates the structure of such an HDP-CVD system 610, which includes a chamber 613, a vacuum system 670, a source plasma system 680A, a bias plasma system 680B, a gas delivery system 633, and a remote plasma cleaning system 650.

The upper portion of chamber 613 includes a dome 614, which is made of a ceramic dielectric material, such as aluminum oxide or aluminum nitride. Dome 614 defines an upper boundary of a plasma processing region 616. Plasma processing region 616 is bounded on the bottom by the upper surface of a substrate 617 and a substrate support member 618.

A heater plate 623 and a cold plate 624 surmount, and are thermally coupled to, dome 614. Heater plate 623 and cold plate 624 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 613 includes a body member 622, which joins the chamber to the vacuum system. A base portion 621 of substrate support member 618 is mounted on, and forms a continuous inner surface with, body member 622. Substrates are transferred into and out of chamber 613 by a robot blade (not shown) through an insertion/removal opening (not shown) in the side of chamber 613. Lift pins (not shown) are raised and then lowered under the control of a motor (also not shown) to move the substrate from the robot blade at an upper loading position 657 to a lower processing position 656 in which the substrate is placed on a substrate receiving portion 619 of substrate support member 618. Substrate receiving portion 619 includes an electrostatic chuck 620 that secures the substrate to substrate support member 618 during substrate processing. In a preferred embodiment, substrate support member 618 is made from an aluminum oxide or aluminum ceramic material.

Vacuum system 670 includes throttle body 625, which houses twin-blade throttle valve 626 and is attached to gate valve 627 and small-molecule-enhanced turbomolecular pump 628. As described in detail below, the turbomolecular pump 628 has the modified performance characteristics making it suitable for efficient exhaustion of low-mass molecular species. It should be noted that throttle body 625 offers minimum obstruction to gas flow, and allows symmetric pumping. Gate valve 627 can isolate pump 628 from throttle body 625, and can also control chamber pressure by restricting the exhaust flow capacity when throttle valve 626 is fully open. The arrangement of the throttle valve, gate valve, and small-molecule-enhanced turbomolecular pump allow accurate and stable control of chamber pressures from between about 2 millitorr to about 2 torr.

The source plasma system 680A includes a top coil 629 and side coil 630, mounted on dome 614. A symmetrical ground shield (not shown) reduces electrical coupling between the coils. Top coil 629 is powered by top source RF (SRF) generator 631A, whereas side coil 630 is powered by side SRF generator 631B, allowing independent power levels and frequencies of operation for each coil. This dual coil system allows control of the radial ion density in chamber 613, thereby improving plasma uniformity. Side coil 630 and top coil 629 are typically inductively driven, which does not require a complimentary electrode. In a specific embodiment, the top source RF generator 631A provides up to 2,500 watts of RF power at nominally 2 MHz and the side source RF generator 631B provides up to 5,000 watts of RF power at nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 680B includes a bias RF ("BRF") generator 631C and a bias matching network 632C. The bias plasma system 680B capacitively couples substrate portion 617 to body member 622, which act as complimentary electrodes. The bias plasma system 680B serves to enhance the transport of plasma species (e.g., ions) created by the source plasma system 680A to the surface of the substrate. In a specific embodiment, bias RF generator provides up to 5,000 watts of RF power at 13.56 MHz.

RF generators 631A and 631B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 632A and 632B match the output impedance of generators 631A and 631B with their respective coils 629 and 630. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

A gas delivery system 633 provides gases from several sources, 634A–634E chamber for processing the substrate via gas delivery lines 638 (only some of which are shown). As would be understood by a person of skill in the art, the actual sources used for sources 634A–634E and the actual connection of delivery lines 638 to chamber 613 varies depending on the deposition and cleaning processes executed within chamber 613. Gases are introduced into chamber 613 through a gas ring 637 and/or a top nozzle 645. FIG. 6B is a simplified, partial cross-sectional view of chamber 613 showing additional details of gas ring 637.

In one embodiment, first and second gas sources, 634A and 634B, and first and second gas flow controllers, 635A' and 635B', provide gas to ring plenum 636 in gas ring 637 via gas delivery lines 638 (only some of which are shown). Gas ring 637 has a plurality of source gas nozzles 639 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 637 has 12 source gas nozzles made from an aluminum oxide ceramic.

Gas ring 637 also has a plurality of oxidizer gas nozzles 640 (only one of which is shown), which in a preferred embodiment are co-planar with and shorter than source gas nozzles 639, and in one embodiment receive gas from body plenum 641. In some embodiments it is desirable not to mix source gases and oxidizer gases before injecting the gases into chamber 613. In other embodiments, oxidizer gas and source gas may be mixed prior to injecting the gases into chamber 613 by providing apertures (not shown) between body plenum 641 and gas ring plenum 636. In one embodiment, third, fourth, and fifth gas sources, 634C, 634D, and 634D', and third and fourth gas flow controllers, 635C and 635D', provide gas to body plenum via gas delivery lines 638. Additional valves, such as 643B (other valves not shown), may shut off gas from the flow controllers to the chamber. In implementing certain embodiments of the invention, source 634A comprises a silane $SiH_4$ source, source 634B comprises a molecular oxygen $O_2$ source, source 634C comprises a silane $SiH_4$ source, source 634D comprises a helium He source, and source 634D' comprises a molecular hydrogen H$_2$ source.

In embodiments where flammable, toxic, or corrosive gases are used, it may be desirable to eliminate gas remaining in the gas delivery lines after a deposition. This may be accomplished using a 3-way valve, such as valve 643B, to isolate chamber 613 from delivery line 638A and to vent delivery line 638A to vacuum foreline 644, for example. As shown in FIG. 6A, other similar valves, such as 643A and 643C, may be incorporated on other gas delivery lines. Such three-way valves may be placed as close to chamber 613 as practical, to minimize the volume of the unvented gas delivery line (between the three-way valve and the chamber). Additionally, two-way (on-off) valves (not shown) may be placed between a mass flow controller ("MFC") and the chamber or between a gas source and an MFC.

Referring again to FIG. 6A, chamber 613 also has top nozzle 645 and top vent 646. Top nozzle 645 and top vent 646 allow independent control of top and side flows of the gases, which improves film uniformity and allows fine adjustment of the film's deposition and doping parameters. Top vent 646 is an annular opening around top nozzle 645. In one embodiment, first gas source 634A supplies source gas nozzles 639 and top nozzle 645. Source nozzle MFC 635A' controls the amount of gas delivered to source gas nozzles 639 and top nozzle MFC 635A controls the amount of gas delivered to top gas nozzle 645. Similarly, two MFCs 635B and 635B' may be used to control the flow of oxygen to both top vent 646 and oxidizer gas nozzles 640 from a single source of oxygen, such as source 634B. The gases supplied to top nozzle 645 and top vent 646 may be kept separate prior to flowing the gases into chamber 613, or the gases may be mixed in top plenum 648 before they flow into chamber 613. Separate sources of the same gas may be used to supply various portions of the chamber.

A remote microwave-generated plasma cleaning system 650 is provided to periodically clean deposition residues from chamber components. The cleaning system includes a remote microwave generator 651 that creates a plasma from a cleaning gas source 634E (e.g., molecular fluorine, nitrogen trifluoride, other fluorocarbons or equivalents) in reactor cavity 653. The reactive species resulting from this plasma are conveyed to chamber 613 through cleaning gas feed port 654 via applicator tube 655. The materials used to contain the cleaning plasma (e.g., cavity 653 and applicator tube 655) must be resistant to attack by the plasma. The distance between reactor cavity 653 and feed port 654 should be kept as short as practical, since the concentration of desirable plasma species may decline with distance from reactor cavity 653. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 620, do not need to be covered with a dummy wafer or otherwise protected, as may be required with an in situ plasma cleaning process.

A perspective view of the substrate processing chamber 610 with the integrated small-molecule-enhanced turbomolecular pump 628 is shown in FIG. 6C. Input flows to the turbomolecular pump are controlled by gate valve 627 and output flows are provided to exhaust 690, which may be connected with a foreline system as described further below.

Figure 7:
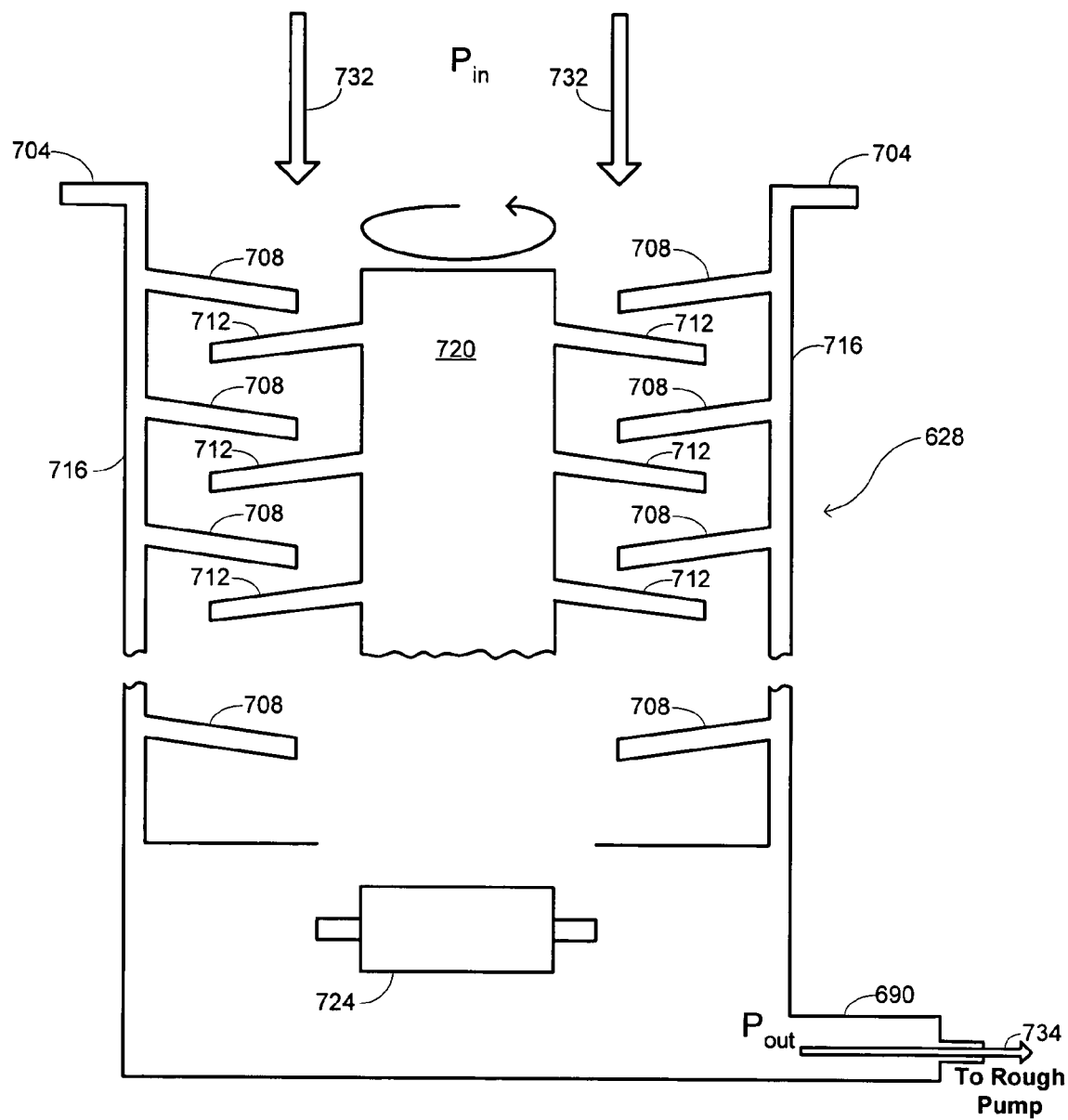
FIG. 7 is a schematic illustration of a structure that may be used for a small-molecule-enhanced turbo pump in embodiments of the invention.

A structure for the small-molecule-enhanced turbomolecular pump 628 is illustrated for an embodiment with FIG. 7. This drawing provides a schematic view of how gas incoming to the pump along flows 732 is mechanically driven to exhaust 690, with a corresponding increase in pressure from $P_{in}$ at the inlet to $P_{out}$ at the outlet. A typical inlet pressure $P_{in}$ corresponds to the chamber pressure and may less than about 10 mtorr, although in some embodiments may be as low as 5 mtorr or as low as 2 mtorr. The outlet pressure $P_{out}$ is generally intermediate between the inlet pressure $P_{in}$ and atmospheric pressure $P_{at}$ and may be about 150 mtorr. The performance of the turbomolecular pump 628 for specific species may be characterized by the relative partial pressures for those species in terms of a "compression ratio," defined as $P_{out}/P_{in}$. The turbomolecular pump 628 has a frame 716 that includes a flange 704 for connection with the gate valve 627. A plurality of stator blades 708 extend radially inwards from the frame and are fixed in position relative to the frame. An interior rotor 720 includes a plurality of rotor blades 712 that extend radially outwards from the rotor such that the rotor blades 712 are interleaved with the fixed stator blades 708. Each combination of a stator and rotor blade is sometimes referred to herein as a "turbine stage" of the pump. The turbomolecular pump 628 is typically cooled with a water cooling system and includes electrical connections to provide power for rotating the rotor 720.

Gas that is introduced into the turbomolecular pump along flows 732 is forced downwards mechanically as the rotor 720 rotates. The atoms, molecules, and ions that may be comprised by the gas are successively forced into successive stages through the mechanical interaction of the rotating rotor blades 712 and fixed stator blades 708, thereby also successively increasing the pressure of the gas. One or more drag stages 724 may also be included to further compress the gas mechanically before it is exhausted through exhaust 690 along flow 734.

There are a number of factors that may affect the compression efficiency of the turbomolecular pump 628 for different molecule sizes, including such factors as the overlap between the stator and rotor blades, the shape of the stator and rotor blades, the relative angles of inclination of the stator and rotor blades, the separation between the stator and rotor blades, the rotational speed of the rotor, the number of turbine stages, the number of drag stages, the inlet flange size, the exhaust size, and the like. Essentially, a variation in any of such factors may affect the statistical chance of a given molecule being trapped within a successive one of the turbine stages and thereby forced downwards. Generally, an increase in the number of turbine stages is more effective at compressing lighter molecules. In some embodiments, for example, between 20 and 25 turbine stages has been found effective at compressing hydrogen molecules, with one embodiment using 23 turbine stages. Also, the rotor and stator blades may approximately be characterized by a width b that accounts for shaping factors; a decrease in the ratio of the distance between blades S to the width b generally results in improved small-molecule compression, with S/b being equal to about 1.05 in one embodiment. In one embodiment, the turbomolecular pump 628 has a single drag stage.

The compression efficiency for the smallest molecule present in the process gas is not the only factor that dictates the desired pump characteristics. For example, it is still necessary to pump other molecules at reasonable efficiencies consistent with the flow rates of the gases that provide those other molecules. Thus, in some embodiments it may be appropriate to sacrifice hydrogen-pumping efficiency in favor of improved large-molecule pumping efficiency, particularly if dopants may be provided through flows of heavy dopant molecules. The inventors have found the following pump characteristics suitable for processes that deposit gapfill silicon oxide with a silane $SiH_4$ flow of 15–100 sccm, an oxygen $O_2$ flow of 25–500 sccm, and an $H_2$ flow of 500–2500 sccm:

TABLE I

Turbomolecular Pump Performance Characteristics

| | | Range | Value |
|---|---|---|---|
| Flange Size (inches) | 200-mm wafer | 8–12 | 10 |
| | 300-mm wafer | 12–16 | 14 |
| Pumping Speed (L/s) | $H_2$ | 2800–3500 | 3150 |
| | He | 2800–3500 | 3150 |
| | N | 3000–3600 | 3200 |
| Compression Ratio | $H_2$ | $(1-10) \times 10^5$ | $2 \times 10^5$ |
| | He | $(1-10) \times 10^6$ | $2 \times 10^6$ |
| | N | $(5-20) \times 10^8$ | $1 \times 10^9$ |
| Rated Speed (rpm) | 200-mm wafer | 2400–3000 | 2700 |
| | 300-mm wafer | 2000–2600 | 2400 |

In this table, the values set forth for N are used for convenience to illustrate pumping rates and compression ratios suitable for heavier species in the plasma. With these pump performance characteristics for the exemplary process described above, the chamber pressure may be maintained at less than 10 mtorr for both 200-mm-wafer and 300-mm-wafer processes. This may be contrasted with pressures that exceed 25 mtorr using the same process in a system that uses a conventional turbomolecular pump.

Figure 8:
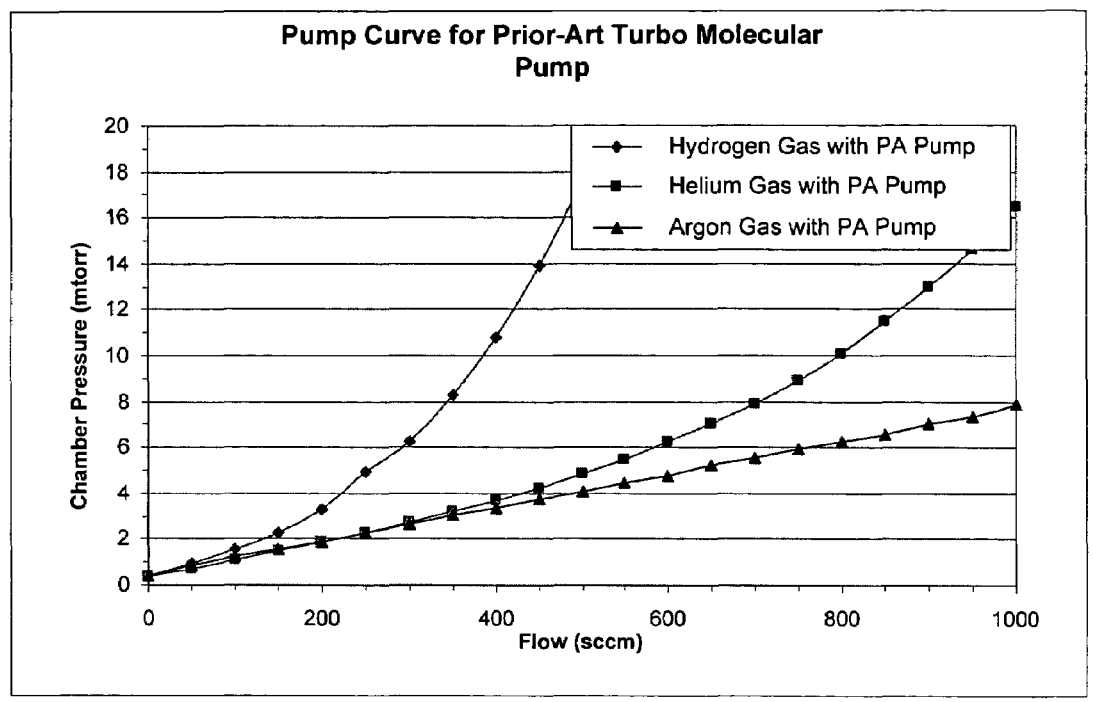
FIG. 8 is a graph illustrating the effect on chamber pressure of flow rates for different fluent gases with a prior-art configuration for a turbo molecular pump.
Figure 9A:
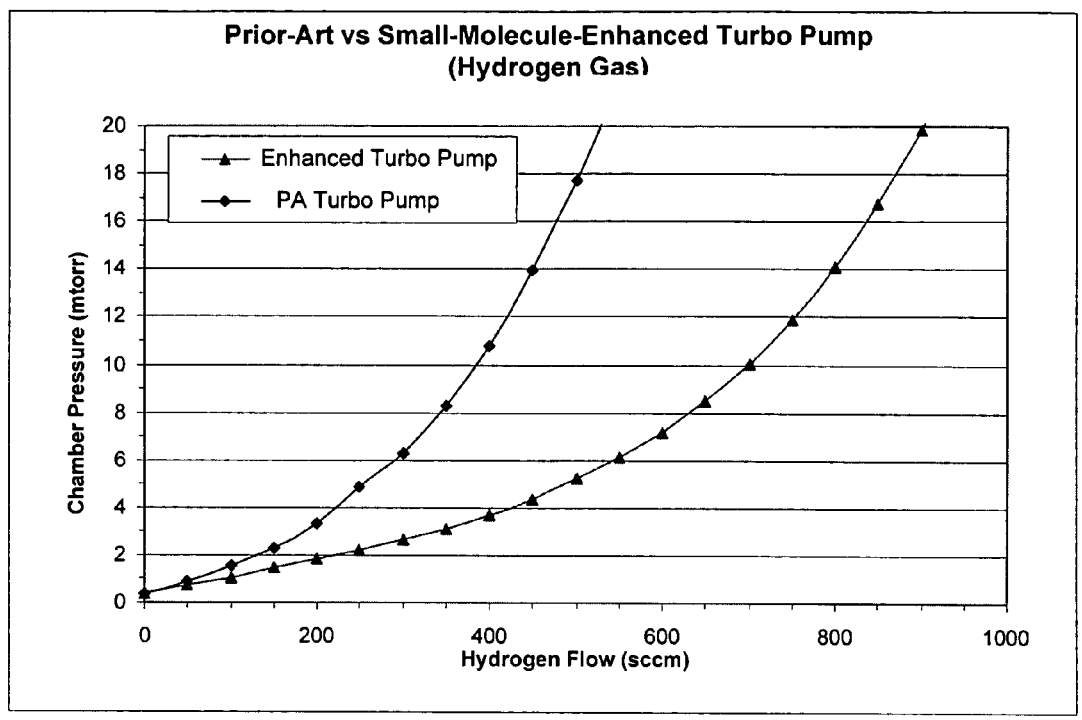
FIGS. 9A and 9B are graphs showing a comparison of chamber pressure versus flow rate for small-molecule-enhanced and prior-art turbo pumps.
Figure 9B:
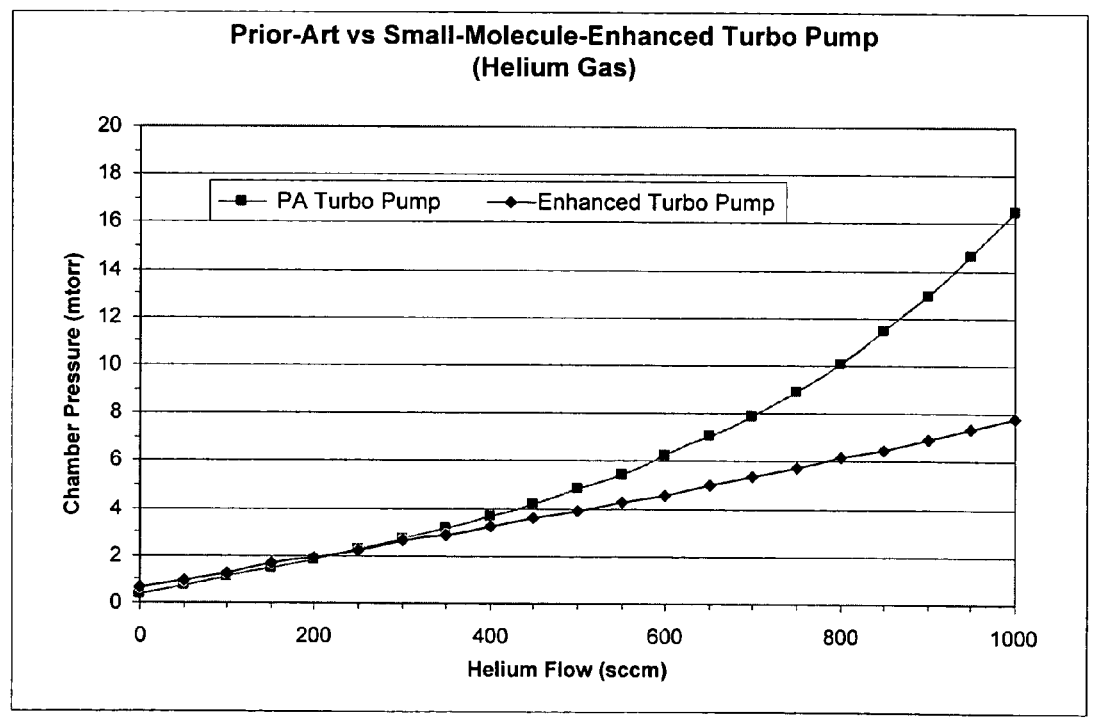

A comparison of the effects of using a turbomolecular pump having these performance characteristics is illustrated with graphical results in FIGS. 8–9B. FIG. 8 provides a plot of chamber pressure as a function of fluent flow for $H_2$, He, and Ar using a prior-art turbomolecular pump. It is evident that the effect of flow rate on pressure is greater for smaller molecules, and especially for $H_2$ since there is even a dramatic increase in pressure when $H_2$ is used even in regions up to about 500 sccm where the difference in pressures when using He versus Ar is still modest. Thus, while a reduction in pressure is desirable for processes that use high flow rates of He, the benefit of being able to reduce the pressure with the enhanced turbomolecular pump is especially acute for processes that use high flow rates of $H_2$.

FIGS. 9A and 9B compare the pressures provided as a function of flow rate between systems that use the prior-art and enhanced turbomolecular pumps for $H_2$ and He respectively. The effect of using the enhanced turbomolecular pump is seen particularly in the results for $H_2$, in which the pressure may be reduced by more than a factor of four at flow rates above 500 sccm. The effect is also significant for He flows when the flow rates are large, producing approximately a factor-of-two reduction in chamber pressure when the flow rate is about 1200 sccm. Thus, the use of a small-molecule-enhanced turbomolecular pump as described herein enables gapfill deposition using high flows of fluent gases at chamber pressures that are below 15 mtorr, below 10 mtorr, or below 5 mtorr in different embodiments.

Another factor that the inventors have identified as enabling a reduction in chamber pressure for such high-flow processes is the layout of the foreline. Generally, the exhaust 690 of the turbomolecular pump 628 is connected with a rough pump that further compresses the exhausted gas to atmospheric pressure so that scrubbing processes may be used on any output toxic gases. It will be understood in the art that a "rough pump" is a pump used to bring pressure in a system to a pressure intermediate between a desired operational pressure and atmospheric pressure. The connection between the turbomolecular pump 628 and the rough pump is made by the foreline, which may be routed according to physical layouts of a facility that holds the substrate processing chamber. One such facility may, in some instances, have multiple forelines connecting different substrate processing systems with a single rough pump. The inventors have recognized that because the foreline provides part of a fluid communication between the rough pump and the substrate processing chamber, certain specific characteristics of the foreline may affect the pressure. Accordingly, modifications in the foreline may be used in embodiments of the invention to achieve even further reductions in chamber pressure.

Figure 10:
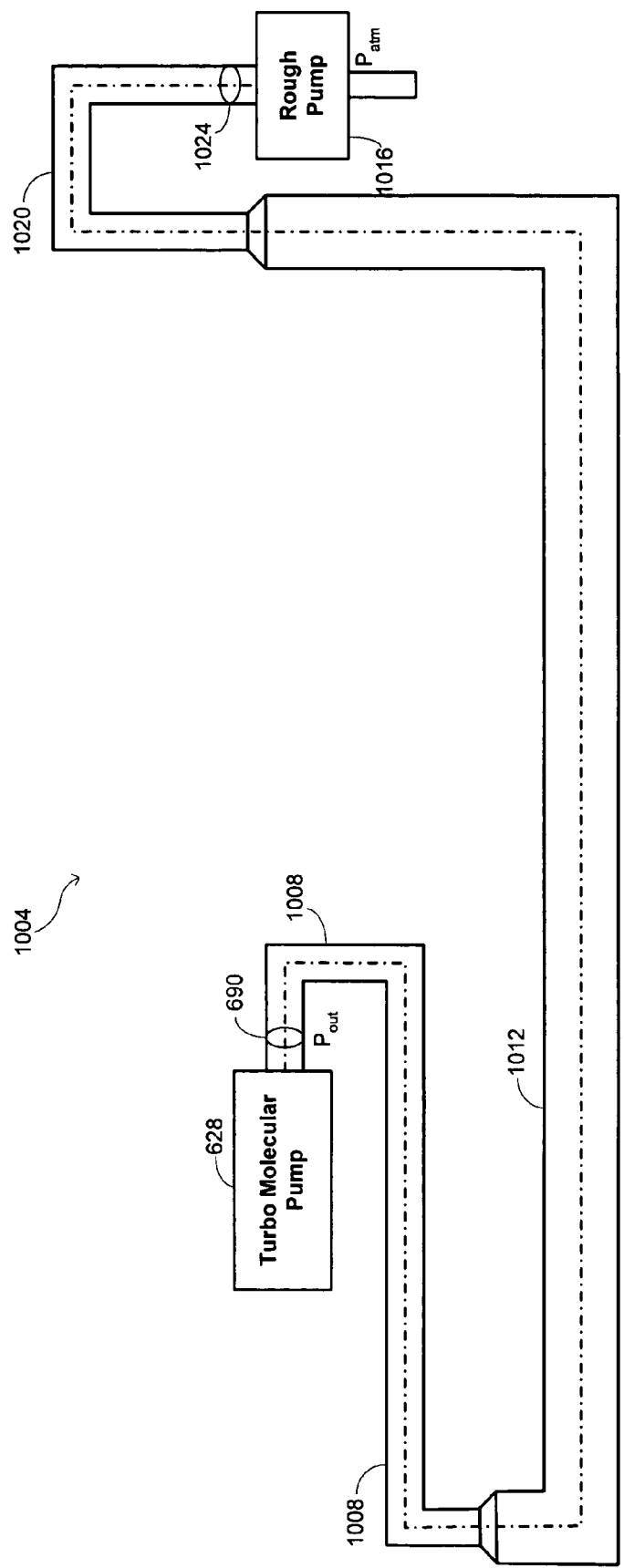
FIG. 10 is an illustration of a foreline layout for an exemplary semiconductor-processing facility.

Merely for purposes of illustration, FIG. 10 shows an example of a foreline 1004 that connects the exhaust 690 of a turbomolecular pump 628 to an inlet 1024 of a rough pump 1016. The foreline 1004 may comprise a plurality of sections, such as sections 1008, 1012, and 1020 that have different tubing sizes. For example, the initial and final sections 1008 and 1020 in the example may have tubing sizes of about 2 inches, while the intermediate section has a tubing size of about 4 inches. An increase in the tubing size of all or a portion of the foreline 1004 may thus result in a decrease in chamber pressure. For example, in one instance, a decrease in chamber pressure may be achieved by replacing the 2-inch section 1020 of tubing with 4-inch tubing. In another instance, both the 2-inch sections 1008 and 1020 of tubing may be replaced with 4-inch tubing, and the intermediate 4-inch tubing section 1012 replaced with 6-inch tubing. By making such modifications, the outlet pressure Pout of the turbomolecular pump may be reduced, thereby providing a reduction in the inlet pressure Pin that corresponds to the chamber pressure.

Figure 11:
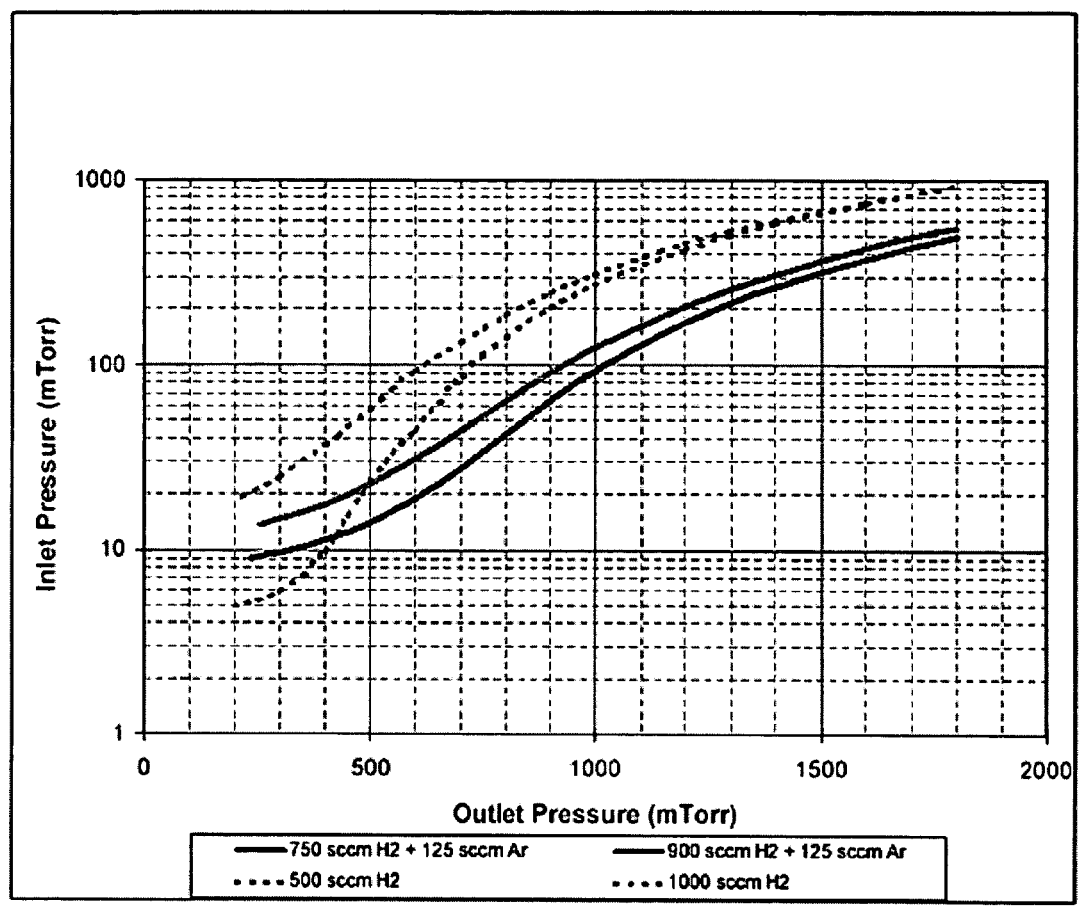
FIG. 11 is a graph illustrating the effect of the outlet pressure of a foreline in a semiconductor processing facility on the chamber pressure of a substrate processing chamber.

The level of improvement that may be achieved with such replacements is illustrated for several examples in FIG. 11, which provides a set of curves relating the outlet pressure $P_{out}$ of the small-molecule-enhanced turbomolecular pump to the inlet pressure $P_{in}$ for a number of different fluent flows, namely 1000 sccm $H_2$ (top curve), 500 sccm $H_2$ (second curve), 900 sccm $H_2$+125 sccm Ar (third curve), and 750 sccm $H_2$+125 sccm Ar (bottom curve). In all instances, it is apparent that achieving a reduction in outlet pressure by reconfiguring the foreline 1004 may provide a further reduction in chamber pressure. While dependent on which curve is relevant and on what the flow rate is, the inventors have found that a reduction in outlet pressure of about 50 mtorr achieved by reconfiguring the foreline may generally translate into about a 2-mtorr reduction in chamber pressure.

Figure 12:
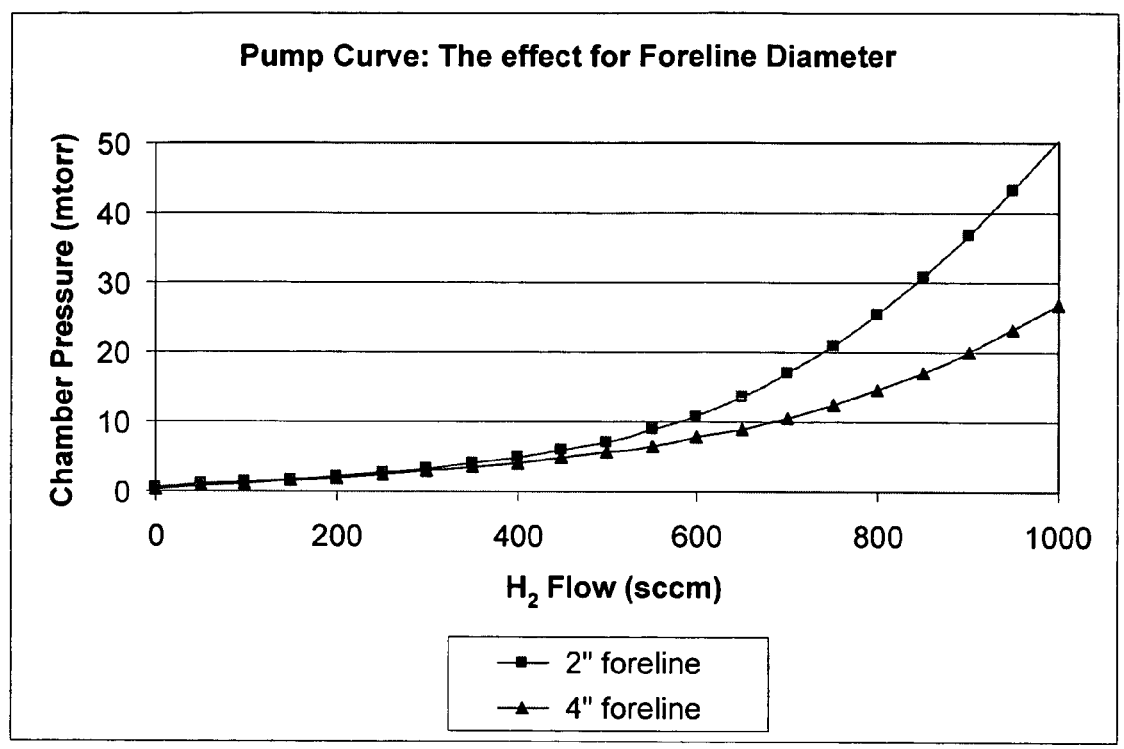
FIG. 12 is a graph illustrating the effect of a change in foreline diameter on chamber pressure.

This effect is illustrated more directly with FIG. 12, which provides results of experiments in which the two-inch foreline connected with a substrate processing system was substituted with a four-inch foreline. The resulting chamber pressure is plotted for different flow rates of $H_2$ for both the two-inch and four-inch configurations, with the top curve corresponding to the two-inch configuration and the bottom curve corresponding to the four-inch configuration. It is apparent from these results that the increase in tubing size provides a further reduction in chamber pressure. This reduction may be provided with both a prior-art turbomolecular pump or with the small-molecule enhanced turbomolecular pump.

In addition to the absolute size of the tubing that connects the turbomolecular pump 628 with the rough pump 1016, the inventors have found that the exhaust pressure may also be affected by the number of bends in the tubing. For example, FIG. 10 shows a foreline layout 1004 in which the first section 1008 has three 90° bends, the second section 1012 has two 90° bends, and the third section has two 90° bends. If the facility that houses the substrate processing system may accommodate a foreline layout that reduces the number of bends, the chamber pressure may be reduced further.

The following table sets forth an example of a foreline specification that may be provided to customers to ensure that the exhaust pressure of the turbomolecular pump is maintained within a range consistent with the desired chamber pressure. The specification is provided for stainless steel tubing with a rough pump that has a pumping speed of about 500 m$^3$/h at 50 Hz, and is suitable for an H$_2$ fluent gas used in gapfill deposition on a 200-mm wafer. Depending on the size of the tubing, as identified in Column A, a maximum allowable tubing length is set forth in Column C. For each 90° bend in the tubing layout, the number in Column B should be subtracted from the standard allowable length set forth in Column C.

TABLE 2

Foreline Specification for 200-mm H$_2$ Gapfill Process

| Column A Tubing Diameter | Column B Equivalent Length for each 90° Bend | Column C Maximum Allowable Tubing Length |
|---|---|---|
| 2" (5.1 cm) | 2.5' (76.2 cm) | 20.0' (6.1 m) |
| 3" (7.6 cm) | 3.0' (91.4 cm) | 40.0' (12.2 m) |
| 4" (10.1 cm) | 3.5' (106.7 cm) | 60.0' (18.3 m) |
| 5" (12.7 cm) | 4.0' (121.9 cm) | 60.0' (18.3 m) |
| 6" (15.2 cm) | 4.5' (137.2 cm) | 60.0' (18.3 m) |

Still a further way in which the foreline arrangement may be modified to reduce the outlet pressure of the turbomolecular pump is to increase the pumping speed of the rough pump, such as by replacing the rough pump with another pump having a higher rated speed. A typical pump used in HDP-processing systems has a pumping speed of about 500 m$^3$/h, but in certain embodiments that use high flows of small molecules, a rough having a pumping speed of at least 1000 m$^3$/h or of at least 1500 m$^3$/h may be used to achieve reduced chamber pressure.

Those of ordinary skill in the art will realize that processing parameters can vary for different processing chambers and different processing conditions, and that different precursors can be used without departing from the spirit of the invention. Other variations will also be apparent to persons of skill in the art. These equivalents and alternatives are intended to be included within the scope of the present invention. Therefore, the scope of this invention should not be limited to the embodiments described, but should instead be defined by the following claims.

What is claimed is:

1. A method of depositing a silicon oxide film over a substrate disposed in a substrate processing chamber, the substrate having a trench formed between adjacent raised surfaces, the method comprising:
   flowing a process gas comprising a silicon source, an oxygen source, and a fluent gas into the substrate processing chamber, wherein the fluent gas has an average molecular mass less than 10 atomic mass units and is flowed into the substrate processing chamber with a flow rate that exceeds 400 sccm;
   forming a plasma having an ion density of at least 10$^{11}$ ions/cm$^3$ from the process gas to deposit the silicon oxide film over the substrate and within the trench; and
   pumping the process gas from the substrate processing chamber with a pump that provides a compression ratio for the fluent gas that exceeds 10$^5$.

2. The method recited in claim 1 wherein the fluent gas comprises H$_2$.

3. The method recited in claim 2 wherein the pump provides a compression ratio for H$_2$ between 10$^5$ and 10$^6$.

4. The method recited in claim 1 wherein the fluent gas comprises He.

5. The method recited in claim 4 wherein the pump provides a compression ratio for He between 10$^6$ and 10$^7$.

6. The method recited in claim 1 wherein the fluent gas comprises a plurality of molecules having different chemical structures, at least some of the molecules being selected from the group consisting of H$_2$ and He.

7. The method recited in claim 1 wherein the flow rate for the fluent gas exceeds 800 sccm.

8. The method recited in claim 1 wherein the flow rate for the fluent gas exceeds 1200 sccm.

9. The method recited in claim 1 wherein the silicon source comprises SiH$_4$.

10. The method recited in claim 1 wherein the oxygen source comprises O$_2$.

11. The method recited in claim 1 wherein the process gas further comprises a dopant source to dope the silicon oxide film.

12. A method of depositing a silicon oxide film over a substrate disposed in a substrate processing chamber, the substrate having a trench formed between adjacent raised surfaces, the method comprising:
    flowing a process gas comprising a silicon source, an oxygen source, and a fluent gas into the substrate processing chamber, wherein the fluent gas has an average molecular mass less than 10 atomic mass units and is flowed into the substrate processing chamber with a flow rate that exceeds 400 sccm;
    forming a plasma having an ion density of at least 10$^{11}$ ions/cm$^3$ from the process gas to deposit the silicon oxide film over the substrate and within the trench; and
    maintaining a chamber pressure within the substrate processing chamber less than 15 mtorr.

13. The method recited in claim 12 wherein the fluent gas comprises H$_2$.

14. The method recited in claim 12 wherein the fluent gas comprises He.

15. The method recited in claim 12 wherein the fluent gas comprises a plurality of molecules having different chemical structures, at least some of the molecules being selected from the group consisting of H$_2$ and He.

16. The method recited in claim 12 wherein the flow rate for the fluent gas exceeds 800 sccm.

17. The method recited in claim 12 wherein the flow rate for the fluent gas exceeds 1200 sccm.

18. The method recited in claim 12 wherein the silicon source comprises SiH$_4$.

19. The method recited in claim 12 wherein the oxygen source comprises O$_2$.

20. The method recited in claim 12 wherein the process gas further comprises a dopant source to dope the silicon oxide film.

21. The method recited in claim 12 wherein maintaining the chamber pressure comprises maintaining the chamber pressure within the substrate processing chamber less than 10 mtorr.

22. The method recited in claim 12 wherein maintaining the chamber pressure comprises maintaining the chamber pressure within the substrate processing chamber less than 5 mtorr.

23. A method of depositing a silicon oxide film over a substrate disposed in a substrate processing chamber, the substrate having a trench formed between adjacent raised surfaces, the method comprising:

flowing a process gas comprising monosilane $SiH_4$, oxygen $O_2$, and a fluent gas having an average molecular mass less than 10 atomic mass units into the substrate processing chamber, wherein the fluent gas is flowed with a flow rate that exceeds 400 sccm;

forming a plasma having an ion density of at least $10^{11}$ ions/cm$^3$ from the process gas to deposit the silicon oxide film over the substrate and within the trench with a process that has simultaneous deposition and sputtering components;

pumping the process gas from the process chamber with a pump that provides a compression ratio for the fluent gas that exceeds $10^5$; and maintaining a chamber pressure within the substrate processing chamber less than 10 mtorr.

24. The method recited in claim 23 wherein the fluent gas has an average molecular mass of about 4 amu or less.

25. The method recited in claim 23 wherein the fluent gas has an average molecular mass of about 2 amu.

26. The method recited in claim 23 wherein the flow rate for the fluent gas exceeds 800 sccm.

27. The method recited in claim 23 wherein the flow rate for the fluent gas exceeds 1200 sccm.

28. The method recited in claim 23 wherein maintaining the chamber pressure comprises maintaining the chamber pressure within the substrate processing chamber less than 5 mtorr.

* * * * *